(12) United States Patent
Melanson et al.

(10) Patent No.: US 9,407,279 B2
(45) Date of Patent: Aug. 2, 2016

(54) SYSTEMS AND METHODS OF ELEMENT SCRAMBLING FOR COMPENSATION AND CALIBRATION OF ANALOG-TO-DIGITAL CONVERTER FEEDBACK

(71) Applicant: Cirrus Logic, Inc., Austin, TX (US)

(72) Inventors: John L. Melanson, Austin, TX (US); Jaimin Mehta, Austin, TX (US); Stephen T. Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/617,376

(22) Filed: Feb. 9, 2015

(65) Prior Publication Data
US 2016/0006448 A1    Jan. 7, 2016

Related U.S. Application Data

(60) Provisional application No. 62/020,706, filed on Jul. 3, 2014, provisional application No. 62/023,057, filed on Jul. 10, 2014.

(51) Int. Cl.
*H03M 1/10* (2006.01)
*H03M 1/06* (2006.01)
(Continued)

(52) U.S. Cl.
CPC .............. *H03M 1/1038* (2013.01); *H03M 1/06* (2013.01); *H03M 1/0665* (2013.01); *H03M 1/10* (2013.01); *H03M 1/1009* (2013.01); *H03M 1/0863* (2013.01); *H03M 1/66* (2013.01); *H03M 3/458* (2013.01)
(Continued)

(58) Field of Classification Search
CPC ....... H03M 1/06; H03M 1/001; H03M 1/124; H03M 1/10; H03M 1/1009; H03M 1/009; H03M 1/66; H03M 3/458
USPC .................................................. 341/120, 155
See application file for complete search history.

(56) References Cited

U.S. PATENT DOCUMENTS 5,305,004 A * 4/1994 Fattaruso ............ H03M 1/0673
341/120
6,346,898 B1    2/2002 Melanson
(Continued)

FOREIGN PATENT DOCUMENTS

EP          2482461 A2     8/2012

OTHER PUBLICATIONS

Sunyal, Arindam et al., A Thermometer-Like Mismatch Shaping Technique with Minimum Element Transition Activity for Multibit Delta-Sigma DACs, IEEE Transactions on Circuits and Systems II: Express Briefs, vol. 61, No. 7, Jul. 2014, pp. 461-165.
(Continued)

*Primary Examiner* — Brian Young
(74) *Attorney, Agent, or Firm* — Jackson Walker L.L.P.

(57) ABSTRACT

An apparatus may include a scrambler element configured to receive an input signal and generate a scrambled thermometer code-like signal having a plurality of bits based on the input signal and having a plurality of possible quantization values. The scrambler element may generate at least one equivalent code of the scrambled thermometer code-like signal for each possible quantization value. For each of one or more of the possible quantization values, the scrambler element may be configured to generate a plurality of possible equivalent codes of the scrambled thermometer code-like signal. Responsive to the input signal indicating a change in quantization value of the scrambled thermometer code-like signal, the scrambler element may change the scrambled thermometer code-like signal by transitioning the smallest possible number of the plurality of bits of the scrambled thermometer code-like signal to change quantization value of the scrambled thermometer code-like signal in accordance with the input signal.

32 Claims, 6 Drawing Sheets

(51) Int. Cl.
*H03M 1/08* (2006.01)
*H03M 1/66* (2006.01)
*H03M 3/00* (2006.01)

(56) References Cited

U.S. PATENT DOCUMENTS

| | | | |
|---|---|---|---|
| 6,369,733 B1 | 4/2002 | Tucker et al. | |
| 6,384,761 B1 | 5/2002 | Melanson | |
| 6,449,569 B1 | 9/2002 | Melanson | |
| 7,916,050 B1 * | 3/2011 | Mujica | H03M 1/004 341/118 |
| 7,916,051 B1 * | 3/2011 | Sestok | 341/120 |
| 8,144,043 B2 | 3/2012 | Risbo et al. | |
| 8,836,550 B2 * | 9/2014 | Snelgrove | H03M 1/1033 341/118 |
| 2007/0146182 A1 | 6/2007 | Chen et al. | |
| 2011/0279292 A1 | 11/2011 | Parida et al. | |

OTHER PUBLICATIONS

Sanyal Arindam et al., "A Thermometer-Like Mismatch Shaping Technique with Minimum Element Transition Activity for Multibit $\Delta\Sigma$ DACs", IEEE Transactions on Circuits and Systems II: Express Briefs, IEEE, US, vol. 61, No. 7, May 29, 2014, pp. 461-465.

Meng-Hung Shen et al., "Random Swapping Dynamic Element Matching Technique for Glitch Energy Minimization in Current-Steering DAC", IEEE Transactions on Circuits and Systems II: Express Briefs, IEEE, US, vol. 57, No. 5, May 1, 2010, pp. 369-373.

Tao Shui et al, "Mismatch Shaping for a Current-Mode Multibit Delta-Sigma DAC", IEEE Journal of Solid-State Circuits, IEEE Service Center, Piscataway, NJ, USA, vol. 34, No. 3, Mar. 1, 1999.

Wang Peijun et al., "A Random DEM Technique with Minimal Element Transition Rate for High-Speed DACs", 2014 IEEE International Symposium on Circuits and Systems (ISCAS), IEEE, Jun. 1, 2014, pp. 1155-1158.

Jiang Yu, "A Low-Power Multibit [Sigma] [Delta] Modulator in 90-nm Digital CMOS without DEM", IEEE Journal of Solid State Circuits, Dec. 1, 2005, pp. 2428-2436.

Westerbacka M et al., "Dynamic Element Matching in D/A Converters with Restricted Scrambling", Electronics, Circuits and Systems, 2000, The 7th IEEE International Conference on Dec. 17-20, 2000, Piscataway, NJ, US, Vol. 1, Dec. 17, 2000, pp. 36-39.

International Search Report and Written Opinion, International Application No. PCT/US2015/036211, mailed Jan. 21, 2016, 27 pages.

* cited by examiner

| CYCLE | INPUT DIGITAL SIGNAL | SCRAMBLED THERMOMETER CODE-LIKE SIGNAL |
|---|---|---|
| 0 | ---- | 0000 0000 1111 1111 |
| 1 | +1 | 0010 0000 1111 1111 |
| 2 | +1 | 0010 1000 1111 1111 |
| 3 | 0 | 0010 1000 1111 1111 |
| 4 | -1 | 0010 1000 1111 1011 |
| 5 | -1 | 0010 1000 1111 1010 |
| 6 | 0 | 0010 1000 1111 1010 |

700

| CYCLE | INPUT DIGITAL SIGNAL | SCRAMBLED THERMOMETER CODE-LIKE SIGNAL | TOGGLE |
|---|---|---|---|
| 0 | ---- | 0000 0000 1111 1111 | 0 |
| 1 | +1 | 0010 0000 1111 1111 | 0 |
| 2 | +1 | 0010 1000 1111 1111 | 0 |
| 3 | 0 | 0010 1000 1111 1111 | 0 |
| 4 | -1 | 0010 1000 1111 1011 | 0 |
| 5 | -1 | 0010 1000 1111 1010 | 1 |
| 6 | 0 | 0010 1010 1011 1010 | 1 |

| CYCLE | INPUT DIGITAL SIGNAL | SCRAMBLED THERMOMETER CODE-LIKE SIGNAL | TOGGLE |
|---|---|---|---|
| 0 | ---- | 0000 0000 1111 1111 | 0 |
| 1 | +1 | 0010 0000 1111 1111 | 0 |
| 2 | +1 | 0110 1001 1101 1111 | 1 |
| 3 | 0 | 0110 1001 1101 1111 | 1 |
| 4 | -1 | 0110 1011 0101 1110 | 1 |
| 5 | -1 | 0110 1011 0101 0110 | 0 |
| 6 | 0 | 0110 1011 0001 0111 | 0 |

| CYCLE | INPUT DIGITAL SIGNAL | SCRAMBLED THERMOMETER CODE-LIKE SIGNAL |
|---|---|---|
| 0 | ---- | 0000 0000 1111 1111 |
| 1 | +1 | 1000 0100 1111 1110 |
| 2 | +1 | 0001 0100 1111 1111 |
| 3 | 0 | 1001 0100 1111 1110 |
| 4 | 0 | 0001 0100 1111 1111 |
| 5 | -1 | 1001 0100 0111 1110 |
| 6 | -1 | 0001 0100 0101 1111 |
| 7 | 0 | 1001 0100 0101 1110 |
| 8 | 0 | 0001 0100 0101 1111 |
| 9 | +1 | 1001 0110 0101 1110 |
| 10 | -1 | 0001 0100 0101 1111 |

FIG. 10

SYSTEMS AND METHODS OF ELEMENT SCRAMBLING FOR COMPENSATION AND CALIBRATION OF ANALOG-TO-DIGITAL CONVERTER FEEDBACK

RELATED APPLICATION

The present disclosure claims priority to U.S. Provisional Patent Application Ser. No. 62/020,706, filed Jul. 3, 2014, and U.S. Provisional Patent Application Ser. No. 62/023,057, filed Jul. 10, 2014, both of which are incorporated by reference herein.

FIELD OF DISCLOSURE

The present disclosure relates in general to data processing systems, and more particularly, to scrambling selection elements in a feedback path of an analog-to-digital converter.

BACKGROUND

Signal and data processing systems often employ analog-to-digital converters (ADCs) for converting an analog signal (e.g., an audio signal received via a microphone, an analog signal received with radio-frequency communication, etc.) into a corresponding digital signal which may be further processed (e.g., by a digital signal processor). In many applications, an ADC may be implemented using a delta-sigma converter. Delta sigma converters are subject to intersymbol interference (ISI), mismatched levels (in the case of multi-level quantization), mismatched components (typically in a feedback digital-to-analog feedback path of an ADC), and various other hardware-based imperfections that limit accuracy and may vary from converter to converter.

Numerous approaches have been employed to compensate or correct for the imperfections of delta-sigma converters. For example, U.S. Pat. No. 6,449,569 to John Laurence Melanson (the "'569 reference") discloses signal processing techniques for correcting distortion in a delta-sigma modulator. The technique disclosed in the '569 reference relies on the natural behavior of an ADC to generate operating modes that allow correction to take place. FIG. 1 depicts an example continuous-time ADC 100, as is known in the art. An analog input signal may be input to a loop filter 102 (which may be implemented using a delta-sigma modulator), the output of which is quantized by a quantizer 104 into a digital output signal having N bits. If thermometer coding is used for the digital output signal, the digital output signal will have N levels, wherein the level of the digital output signal is indicated by the number of bits of the N-bit digital output signal which are asserted. In the feedback path of ADC 100, a dynamic element matching block 106 may rearrange bits of the digital output signal to generate an equivalent N-bit signal communicated to feedback digital-to-analog converter (DAC) 108. In a thermometer coding implementation, DAC 108 may convert the digital signal into an analog feedback signal that is fed back to loop filter 102 by buffering each bit with a buffer 110 and driving the buffered signal through a corresponding resistor 112, such that the analog feedback signal has a magnitude corresponding to the number of asserted bits of the feedback signal. Ideally, to generate an accurate analog feedback signal, resistors 112 will have identical impedances. However, due to process or temperature variances, their impedances may differ. Without correction for the mismatch in resistors 112, ADC 100 may have an unacceptable amount of non-linearity. While DEM block 106 may effectively convert the resistor mismatched-induced distortion into white noise, many existing DEM techniques may aggravate inter-symbol interference (ISI) error.

SUMMARY

In accordance with the teachings of the present disclosure, certain disadvantages and problems associated with correcting for distortion in an ADC may be reduced or eliminated.

In accordance with embodiments of the present disclosure, an apparatus may include a scrambler element configured to receive an input signal and generate a scrambled thermometer code-like signal having a plurality of bits based on the input signal and having a plurality of possible quantization values. The scrambler element may generate at least one equivalent code of the scrambled thermometer code-like signal for each possible quantization value. For each of one or more of the possible quantization values, the scrambler element may be configured to generate a plurality of possible equivalent codes of the scrambled thermometer code-like signal. Responsive to the input signal indicating a change in quantization value of the scrambled thermometer code-like signal, the scrambler element may change the scrambled thermometer code-like signal by transitioning the smallest possible number of the plurality of bits of the scrambled thermometer code-like signal to change quantization value of the scrambled thermometer code-like signal in accordance with the input signal.

In accordance with these and other embodiments of the present disclosure, a method may include receiving an input signal and generating a scrambled thermometer code-like signal having a plurality of bits based on the input signal and having a plurality of possible quantization values, such that: at least one equivalent code of the scrambled thermometer code-like signal for each possible quantization value is generated; for each of one or more codes of the input digital signal, a plurality of possible equivalent codes of the scrambled thermometer code-like signal may be generated; and responsive to the input signal indicating a change in quantization value of the scrambled thermometer code-like signal, the scrambler element changes the scrambled thermometer code-like signal by transitioning the smallest possible number of the plurality of bits of the scrambled thermometer code-like signal to change quantization value of the scrambled thermometer code-like signal in accordance with the input signal.

In accordance with these and other embodiments of the present disclosure, a multilevel analog-to-digital converter having digital-to-analog converter array of digital-to-analog elements may include a mismatch correction subsystem and an element selection subsystem. The mismatch correction subsystem may be configured to calculate mismatches among the digital-to-analog elements correcting for the mismatches. The element selection subsystem may be configured to selectively enable and disable digital-to-analog elements in order to generate at least one mismatch signal to the mismatch correction subsystem to calculate the mismatches, wherein the at least one mismatch signal has a magnitude substantially higher than one or more noise sources to the mismatch signal.

In accordance with these and other embodiments of the present disclosure, a method may include, in a multilevel analog-to-digital converter having a digital-to-analog converter array of digital-to-analog elements, calculating mismatches among the digital-to-analog elements correcting for the mismatches. The method may also include selecting enabled and disabled digital-to-analog elements in order to generate at least one mismatch signal to the mismatch correction subsystem to calculate the mismatches, wherein the at least one mismatch signal has a magnitude substantially higher than one or more noise sources to the mismatch signal.

In accordance with these and other embodiments of the present disclosure, an apparatus may include a scrambler element configured to receive an input signal and generate a scrambled thermometer code-like signal having a plurality of bits based on the input signal and having a plurality of possible quantization values. The scrambler element may generate at least one equivalent code of the scrambled thermometer code-like signal for each possible quantization value. For each of one or more of the possible quantization values, the scrambler element may be configured to generate a plurality of possible equivalent codes of the scrambled thermometer code-like signal. Responsive to the input signal, the scrambler element may change the scrambled thermometer code-like signal by transitioning, on average, approximately the same number of the plurality of bits of the scrambled thermometer code-like signal.

In accordance with these and other embodiments of the present disclosure, a method may include receiving an input signal. The method may also include generating a scrambled thermometer code-like signal having a plurality of bits based on the input signal and having a plurality of possible quantization values, such that: at least one equivalent code of the scrambled thermometer code-like signal for each possible quantization value is generated; for each of one or more codes of the input digital signal, a plurality of possible equivalent codes of the scrambled thermometer code-like signal may be generated; and responsive to the input digital signal, the scrambled thermometer code-like signal is changed by transitioning, on average, approximately the same number of the plurality of bits of the scrambled thermometer code-like signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 7 illustrates a table setting forth an example input digital signal over numerous cycles and an example scrambled thermometer code-like signal that may be generated in response to the input digital signal in accordance with the functionality depicted in FIG. 6, and in accordance with embodiments of the present disclosure;

FIG. 9 illustrates a table setting forth an example input digital signal over numerous cycles and an example scrambled thermometer code-like signal that may be generated in response to the input digital signal in accordance with the functionality depicted in FIG. 8, and in accordance with embodiments of the present disclosure; and FIG. 10 shows example values of scrambled thermometer code-like signal over many cycles of an in-operation calibration phase, in accordance with embodiments of the present disclosure.

DETAILED DESCRIPTION

Figure 2:
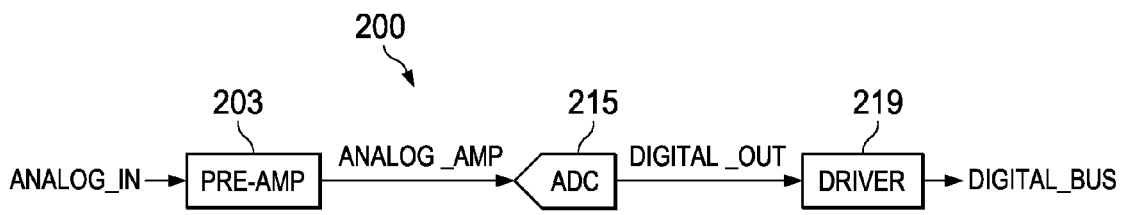
FIG. 2 illustrates a block diagram of selected components of an example signal processing circuit, in accordance with embodiments of the present disclosure.

FIG. 2 illustrates a block diagram of selected components of an example signal processing circuit 200, in accordance with embodiments of the present disclosure. As shown in FIG. 2, signal processing circuit 200 may include a pre-amplifier 203, an analog-to-digital converter (ADC) 215, and a driver 219. Pre-amplifier 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. The output of pre-amplifier 203, an amplified analog input signal ANALOG_AMP, may be communicated to ADC 215 on one or more output lines.

ADC 215 may comprise any suitable system, device, or apparatus configured to convert an analog signal received at its input (e.g., amplified analog input signal ANALOG_AMP), to a digital signal representative of analog input signal ANALOG_IN. ADC 215 may itself include one or more components (e.g., delta-sigma modulator, decimator, etc.) for carrying out the functionality of ADC 215.

Driver 219 may receive a digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital audio output signal DIGITAL_BUS for transmission over a bus to a digital signal processor or other digital circuitry.

Figure 3:
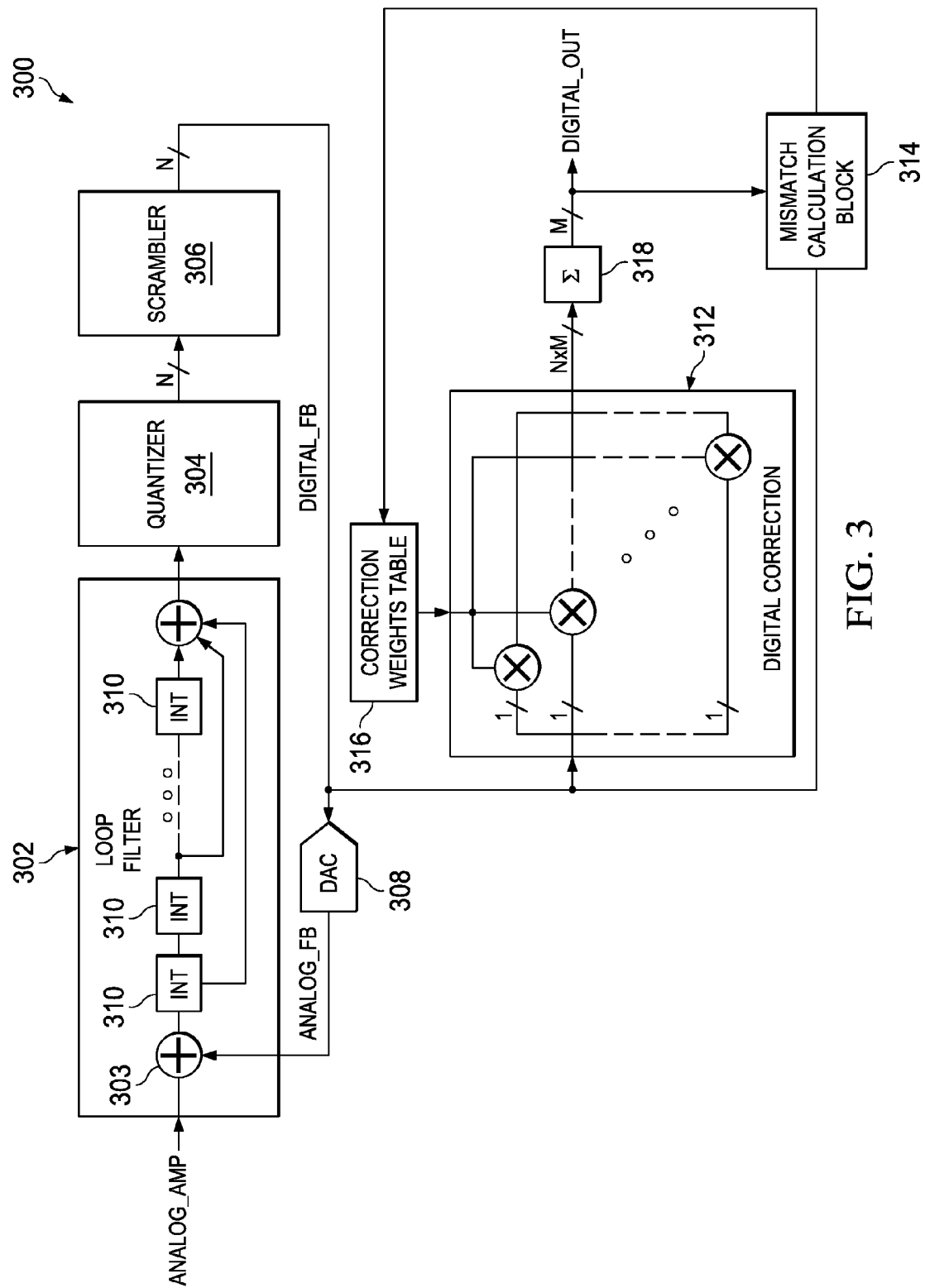
FIG. 3 illustrates a block diagram of selected components of an example ADC, which may be used to implement the ADC depicted in FIG. 2, in accordance with embodiments of the present disclosure.

FIG. 3 illustrates a block diagram of selected components of an example ADC 300, which may be used to implement ADC 215 depicted in FIG. 2, in accordance with embodiments of the present disclosure. As shown in FIG. 3, ADC 300 may include a loop filter 302, a quantizer 304, a scrambler 306, a DAC 308, and a mismatch correction subsystem comprising digital correction block 312, mismatch calculation block 314, correction weights table 316, and summer 318.

Loop filter 302 may comprise an input summer 303 for generating a difference between amplified analog input signal ANALOG_AMP and an analog feedback signal ANALOG_FB, and one or more integrator stages 310, such that loop filter 302 operates as analog filter of an error signal equal to the difference between amplified analog input signal ANALOG_AMP and analog feedback signal ANALOG_FB, and generates a filtered analog signal to quantizer 304 based on amplified analog input signal ANALOG_AMP and analog feedback signal ANALOG_FB (e.g., amplified analog input signal ANALOG_AMP plus a filtered version of analog feedback signal ANALOG_FB). The output from loop filter 302 may be quantized by quantizer 304 which may convert the filtered analog signal into an input digital signal indicative of the value of the analog input signal. In some embodiments, such input digital signal may comprise a thermometer code signal having a plurality of quantization levels. In other embodiments, the input digital signal generated by quantizer 304 for each cycle of quantizer 304 may comprise a signal indicative of a change in the number of equivalent digital quantization levels of the filtered analog signal between consecutive samples of the filtered analog signal. In such embodiments, the change in the input digital signal generated by quantizer 304 for each cycle of quantizer 304 may be limited. For example, in some embodiments, the input digital signal may be limited to values of −1, 0, +1, these values corresponding to a decrease in one equivalent quantization level of the filtered analog signal, no change in equivalent quantization level of the filtered analog signal, or an increase of one equivalent quantization level of the filtered analog signal, respectively.

Scrambler 306 may be configured to receive the input digital signal provided by quantizer 304 and generate a digital feedback signal DIGITAL_FB having a plurality of bits based on the input digital signal. In some embodiments, digital feedback signal DIGITAL_FB may be a scrambled thermometer-code like signal having a quantized value based on the number of bits of the signal asserted. For example, for a four-bit scrambled thermometer code-like signal, the values 0011, 0101, 1001, 0110, 1010, and 1100 may all have the same quantized value. In such example, the weights of each bit position of the scrambled thermometer code-like signal are equivalent. However, in other embodiments, at least one of the bit positions may have a different weight than another one of the bit positions. Thus, for a four-bit scrambled thermometer code-like signal in which the most-significant bit has twice the weight of the other three bits, the values 0011, 0101, 0110, and 1000 may all have the same quantized value. Accordingly, for each quantized value of the scrambled thermometer code-like signal, scrambler 306 may generate at least one equivalent code. In addition, for each of one or more of (but necessarily all) of the quantized value of the scrambled thermometer code-like signal, scrambler 306 may be configured to generate a plurality of possible equivalent codes.

In other embodiments, scrambler 306 may internally generate such scrambled thermometer-code like signal, and then generate digital feedback signal DIGITAL_FB which is not a thermometer-code like signal based on such internally-generated scrambled thermometer-code like signal.

Digital feedback signal DIGITAL_FB which may be fed back to DAC 308 to generate analog feedback signal ANALOG_FB. Thus, scrambler 306, while scrambling data, may maintain advantages of thermometer-type coding (minimization of element transitions which reduces ISI present in DEM and used less power than DEM) while not suffering from the disadvantages of traditional thermometer coding (e.g., high mismatch).

Figure 1:
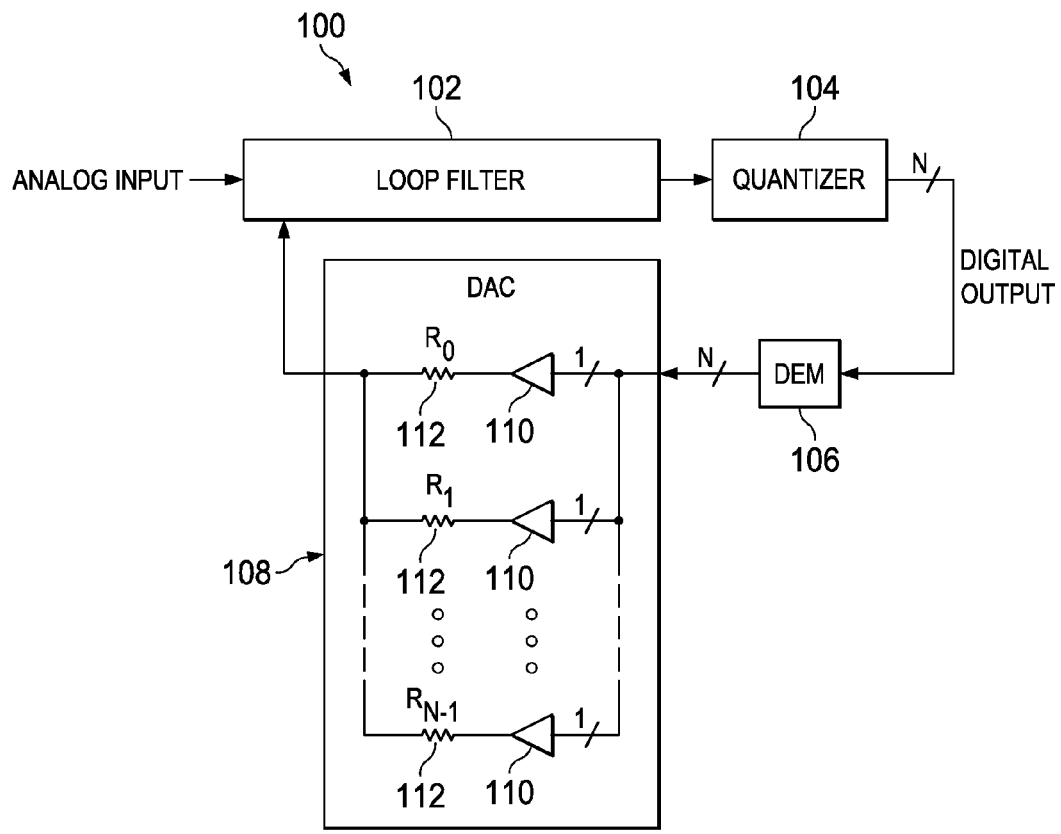
FIG. 1 illustrates a block diagram of an example ADC, as is known in the art.

DAC 308 may comprise any suitable system, device, or apparatus configured to convert digital feedback signal DIGITAL_FB into an equivalent analog feedback signal ANALOG_FB. In some embodiments, DAC 308 may comprise a resistor DAC similar to that described with respect to FIG. 1. Accordingly, in such embodiments, DAC 308 may comprise a digital-to-analog converter array of digital-to-analog elements configured to be selectively enabled and disabled based on the digital output signal. For example, where the digital output signal is a scrambled thermometer code-like signal, the analog feedback signal may be based on the number and/or weights of asserted bits of the scrambled thermometer code-like signal, which may correlate to the number and/or weights of selectively enabled digital-to-analog elements. In embodiments where a narrow input range is desirable, or if certain digital-to-analog elements are required to be used for calibration, some of the digital-to-analog elements may be disabled and a subset of such elements used. Such use of elements may reduce power dissipation and reduce thermally-induced noise of the disabled elements.

The mismatch correction subsystem may be configured to perform calibration of mismatches of digital-to-analog elements of DAC 308 and apply a correction factor based on such calibration in order to generate digital output signal DIGITAL_OUT based on digital feedback signal DIGITAL_FB, as described in greater detail below in this disclosure.

In some embodiments, scrambler 306 may, responsive to a change in the input digital signal, change digital feedback signal DIGITAL_FB by transitioning the smallest possible number of the plurality of bits of the scrambled thermometer code-like signal to generate an equivalent code of the scrambled thermometer code-like signal. An example of such functionality is demonstrated by method 400 depicted in FIG. 4.

Figures 4, 5:
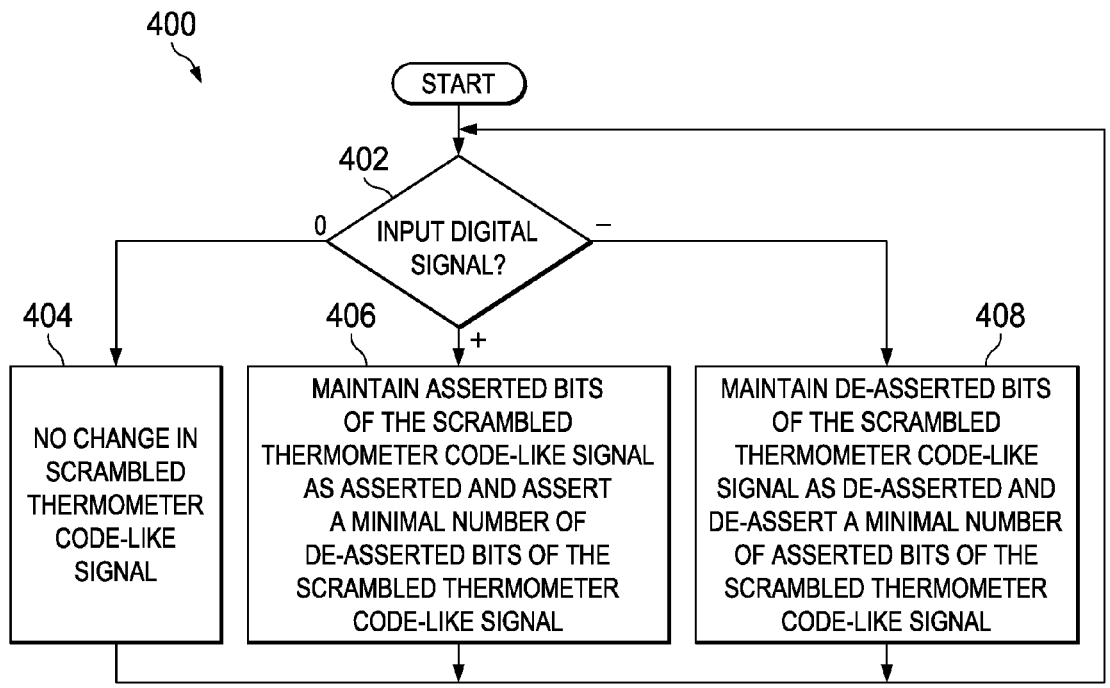
FIG. 4 illustrates a flow chart of an example method for generating a scrambled thermometer code-like signal based on an input digital signal, in accordance with embodiments of the present disclosure.
FIG. 5 illustrates a table setting forth an example input digital signal over numerous cycles and an example scrambled thermometer code-like signal that may be generated in response to the input digital signal in accordance with the functionality depicted in FIG. 4, and in accordance with embodiments of the present disclosure.

FIG. 4 illustrates a flow chart of an example method 400 for generating a scrambled thermometer code-like signal based on an input digital signal. According to certain embodiments, method 400 may begin at step 402. As noted above, teachings of the present disclosure may be implemented in a variety of configurations of ADC 300. As such, the preferred initialization point for method 400 and the order of the steps comprising method 400 may depend on the implementation chosen.

At step 402, scrambler 306 may determine whether the input digital signal indicates an equivalent quantization level change of the sampled filtered analog signal since the most-recent previous cycle. If no change in equivalent quantization level has occurred since the previous cycle, method 400 may proceed to step 404. If an increase in equivalent quantization level has occurred since the previous cycle (e.g., by a quantization level of 1 in embodiments in which the cycle-to-cycle change in the quantized value of digital feedback signal DIGITAL_FB is limited to 1), method 400 may proceed to step 406. If a decrease in equivalent quantization level has occurred since the previous cycle (e.g., by a quantization level of 1 in embodiments in which the cycle-to-cycle change in the quantized value of digital feedback signal DIGITAL_FB is limited to 1), method 400 may proceed to step 408.

At step 404, responsive to no change in equivalent quantization level, scrambler 306 may maintain asserted bits of the scrambled thermometer code-like signal as asserted and maintain de-asserted bits of the scrambled thermometer code-like signal as de-asserted, such that the scrambled thermometer code-like signal does not change. After completion of step 404, method 400 may proceed again to step 402.

At step 406, responsive to an increase in equivalent quantization level, scrambler 306 may maintain asserted bits of the scrambled thermometer code-like signal as asserted and assert a minimal number of de-asserted bits of the scrambled thermometer code-like signal to increase the quantized value of the scrambled thermometer code-like signal (e.g., assert one de-asserted bit in response to an increase in one quantization level of the quantized value). In some embodiments, the de-asserted bits to be asserted are randomly selected by scrambler 306. After completion of step 406, method 400 may proceed again to step 402.

At step 408, responsive to a decrease in equivalent quantization level, scrambler 306 may maintain de-asserted bits of the scrambled thermometer code-like signal as de-asserted and de-assert a minimal number of asserted bits of the scrambled thermometer code-like signal to decrease the quantized value of the scrambled thermometer code-like signal (e.g., de-assert one asserted bit in response to a decrease in one quantization level of the increase the quantized value). In some embodiments, the asserted bits to be de-asserted are randomly selected by scrambler 306. After completion of step 408, method 400 may proceed again to step 402.

Although FIG. 4 discloses a particular number of steps to be taken with respect to method 400, it may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using scrambler 306, components thereof or any other system such as those shown in FIGS. 2 and 3 operable to implement method 400. In certain embodiments, method 400 may be implemented partially or fully in software and/or firmware embodied in computer-readable media.

To demonstrate an example application of the functionality of scrambler 306 shown in FIG. 4, reference is made to FIG. 5. FIG. 5 illustrates a table 500 setting forth an example input digital signal over numerous cycles and an example scrambled thermometer code-like signal that may be generated in response to the input digital signal. In the example shown in table 500, at cycle 0, scrambler 306 may generate a scrambled thermometer code-like signal with value 0000 0000 1111 1111. In cycle 1, the input digital signal indicates an increase by one quantization level, and in response, scrambler 306 randomly selects one of the bits of scrambled thermometer code-like signal de-asserted in cycle 0 to be asserted in cycle 1, while maintaining all asserted bits as asserted. In cycle 2, the input digital signal again indicates an increase by one quantization level, and in response, scrambler 306 randomly selects one of the bits of scrambled thermometer code-like signal de-asserted in cycle 1 to be asserted in cycle 2, while maintaining all asserted bits as asserted. In cycle 3, the input digital signal does not change, and in response, scrambler 306 maintains the scrambled thermometer code-like signal unchanged from cycle 2. In cycle 4, the input digital signal indicates a decrease by one quantization level, and in response, scrambler 306 randomly selects one of the bits of scrambled thermometer code-like signal asserted in cycle 3 to be de-asserted in cycle 4, while maintaining all de-asserted bits as de-asserted. In cycle 5, the input digital signal again indicates a decrease by one quantization level, and in response, scrambler 306 randomly selects one of the bits of scrambled thermometer code-like signal asserted in cycle 4 to be de-asserted in cycle 5, while maintaining all de-asserted bits as de-asserted. In cycle 6, the input digital signal does not change, and in response, scrambler 306 maintains the scrambled thermometer code-like signal unchanged from cycle 5.

In some embodiments, scrambler 306 may, responsive to the input digital signal, change scrambled thermometer code-like signal DIGITAL_FB by transitioning, on a per-cycle average basis, approximately the same number of bits of the scrambled thermometer code-like signal to generate an equivalent code of the scrambled thermometer code-like signal. An example of such functionality is demonstrated by method 600 depicted in FIG. 6 and method 800 depicted in FIG. 8.

Figure 6:
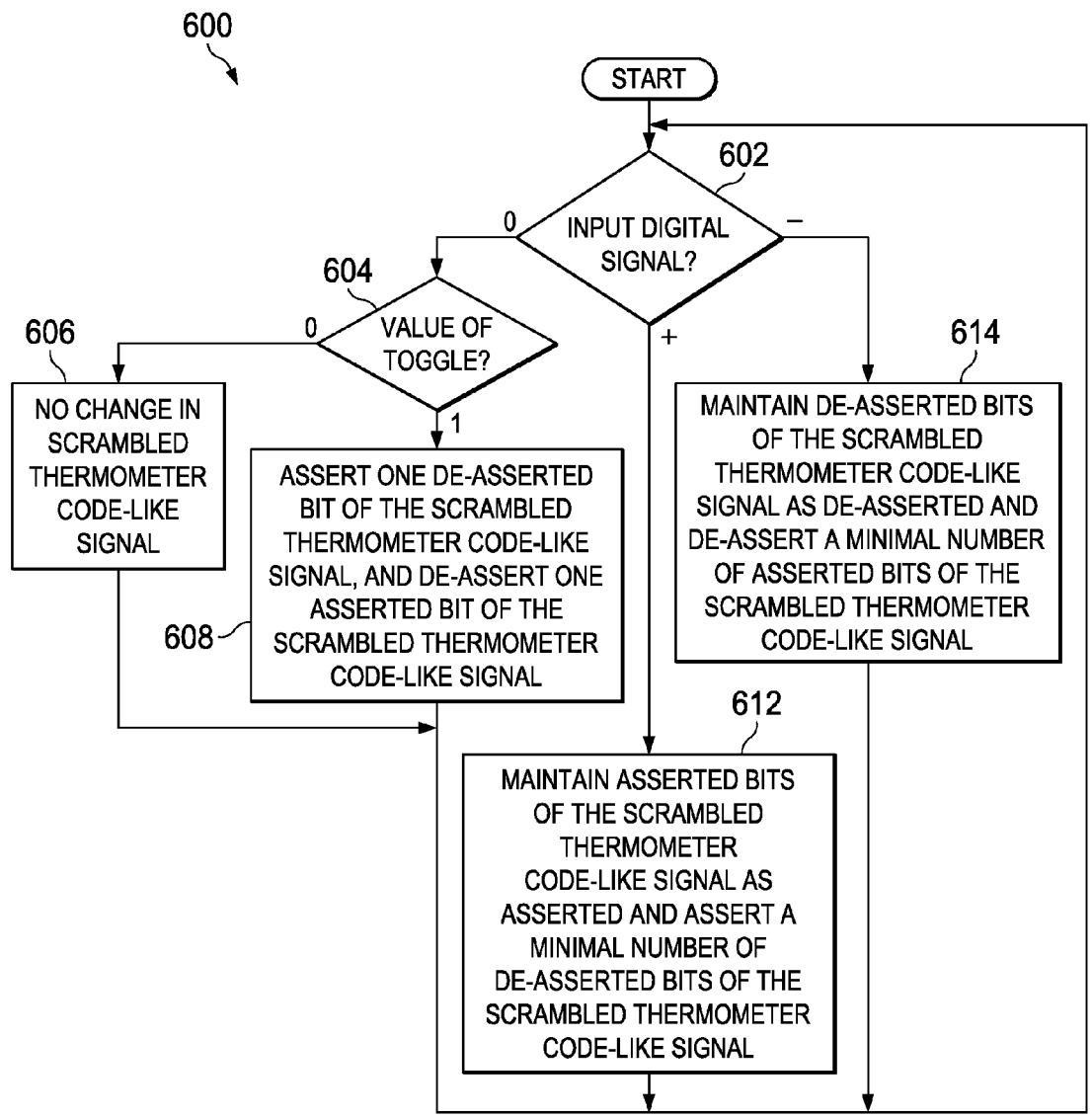
FIG. 6 illustrates a flow chart of another example method for generating a scrambled thermometer code-like signal based on an input digital signal, in accordance with embodiments of the present disclosure.

FIG. 6 illustrates a flow chart of an example method 600 for generating a scrambled thermometer code-like signal based on an input digital signal. According to certain embodiments, method 600 may begin at step 602. As noted above, teachings of the present disclosure may be implemented in a variety of configurations of ADC 300. As such, the preferred initialization point for method 600 and the order of the steps comprising method 600 may depend on the implementation chosen.

At step 602, scrambler 306 may determine whether the input digital signal indicates an equivalent quantization level change of the sampled filtered analog signal since the most-recent previous cycle. If no change in equivalent quantization level has occurred since the previous cycle, method 600 may proceed to step 604. If an increase in equivalent quantization level has occurred since the previous cycle (e.g., by a quantization level of 1 in embodiments in which the cycle-to-cycle change in the quantized value of digital feedback signal DIGITAL_FB is limited to 1), method 600 may proceed to step 612. If a decrease in equivalent quantization level has occurred since the previous cycle (e.g., by a quantization level of 1 in embodiments in which the cycle-to-cycle change in the quantized value of digital feedback signal DIGITAL_FB is limited to 1), method 600 may proceed to step 614.

At step 604, responsive to no change in equivalent quantization level, scrambler 306 may determine the value of a toggle variable. The toggle variable may be a single bit value that toggles between 0 and 1 and indicates whether zero bits or two bits of the scrambled thermometer code-like signal should change in a given cycle in which there is no change in equivalent quantization level. In some embodiments, the toggle variable may toggle in each cycle in which there is no change in equivalent quantization level. In other embodiments, the toggle variable may toggle independently of the input digital signal (e.g., at some set or predetermined frequency). If the toggle variable is 0, method 600 may proceed to step 606. Otherwise, if the toggle variable is 1, method 600 may proceed to step 608.

At step 606, responsive to no change in equivalent quantization level and a toggle value of 0, scrambler 306 may maintain asserted bits of the scrambled thermometer code-like signal as asserted and maintain de-asserted bits of the scrambled thermometer code-like signal as de-asserted, such that the scrambled thermometer code-like signal does not change. After completion of step 606, method 600 may proceed again to step 602.

At step 608, responsive to no change in equivalent quantization level and a toggle value of 1, scrambler 306 may maintain asserted bits of the scrambled thermometer code-like signal except one asserted bit as asserted, maintain de-asserted bits of the scrambled thermometer code-like signal except one asserted bit as de-asserted, assert one de-asserted bit of the scrambled thermometer code-like signal, and de-assert one asserted bit of the scrambled thermometer code-like signal to generate a different code of the scrambled thermometer code-like signal that maintains the same quantized value of the scrambled thermometer code-like signal. In some embodiments, the de-asserted bit to be asserted and the asserted bit to be de-asserted are randomly selected by scrambler 306. Thus, although the scrambled thermometer code-like signal changes, the same number of asserted and de-asserted bits is maintained, and thus the same approximate value of analog feedback signal ANALOG_FB may be generated in response to the scrambled thermometer code-like signal. After completion of step 608, method 600 may proceed again to step 602.

At step 612, responsive to an increase in equivalent quantization level, scrambler 306 may maintain asserted bits of the scrambled thermometer code-like signal as asserted and assert a minimal number of de-asserted bits of the scrambled thermometer code-like signal to increase the quantized value of the scrambled thermometer code-like signal (e.g., assert one de-asserted bit in response to an increase in one quantization level of the quantized value). In some embodiments, the de-asserted bits to be asserted are randomly selected by scrambler 306. After completion of step 612, method 600 may proceed again to step 602.

At step 614, responsive to a decrease in equivalent quantization level, scrambler 306 may maintain de-asserted bits of the scrambled thermometer code-like signal as de-asserted and de-assert a minimal number of asserted bits of the scrambled thermometer code-like signal to decrease the quantized value of the scrambled thermometer code-like signal (e.g., de-assert one asserted bit in response to a decrease in one quantization level of the input digital signal). In some embodiments, the asserted bits to be de-asserted are randomly selected by scrambler 306. After completion of step 614, method 600 may proceed again to step 602.

Although FIG. 6 discloses a particular number of steps to be taken with respect to method 600, it may be executed with greater or lesser steps than those depicted in FIG. 6. In addition, although FIG. 6 discloses a certain order of steps to be taken with respect to method 600, the steps comprising method 600 may be completed in any suitable order.

Method 600 may be implemented using scrambler 306, components thereof or any other system such as those shown in FIGS. 2 and 3 operable to implement method 600. In certain embodiments, method 600 may be implemented partially or fully in software and/or firmware embodied in computer-readable media.

As a result of the application of functionality described in method 600, scrambler 306 may transition, on average over many cycles, approximately one bit of the scrambled thermometer code-like signal per cycle. To demonstrate an example application of the functionality of scrambler 306 shown in FIG. 6, reference is made to FIG. 7. FIG. 7 illustrates a table 700 setting forth an example input digital signal over numerous cycles and an example scrambled thermometer code-like signal that may be generated in response to the input digital signal. In the example shown in table 700, at cycle 0 scrambler 306 may generate a scrambled thermometer code-like signal with value 0000 0000 1111 1111. In cycle 1, the input digital signal indicates an increase by one quantization level, and in response, scrambler 306 randomly selects one of the bits of scrambled thermometer code-like signal de-asserted in cycle 0 to be asserted in cycle 1, while maintaining all asserted bits as asserted. In cycle 2, the input digital signal again indicates an increase by one quantization level, and in response, scrambler 306 randomly selects one of the bits of scrambled thermometer code-like signal de-asserted in cycle 1 to be asserted in cycle 2, while maintaining all asserted bits as asserted. In cycle 3, the input digital signal indicates no change in quantization level, and the toggle variable may have a value of zero, such that in response, scrambler 306 maintains the scrambled thermometer code-like signal unchanged from cycle 2. In cycle 4, the input digital signal indicates a decrease by one quantization level, and in response, scrambler 306 randomly selects one of the bits of scrambled thermometer code-like signal asserted in cycle 3 to be de-asserted in cycle 4, while maintaining all de-asserted bits as de-asserted. In cycle 5, the input digital signal again indicates a decrease by one quantization level, and in response, scrambler 306 randomly selects one of the bits of scrambled thermometer code-like signal asserted in cycle 4 to be de-asserted in cycle 5, while maintaining all de-asserted bits as de-asserted. In cycle 6, the input digital signal indicates no change in quantization level, but in cycle 6, the toggle variable may have a value of 1, and in response, scrambler 306 maintains asserted bits of the scrambled thermometer code-like signal except one asserted bit as asserted, maintains de-asserted bits of the scrambled thermometer code-like signal except one asserted bit as de-asserted, asserts one de-asserted bit of the scrambled thermometer code-like signal, and de-asserts one asserted bit of the scrambled thermometer code-like signal to generate a different code of the scrambled thermometer code-like signal that maintains the same quantized value of the scrambled thermometer code-like signal.

Figure 8:
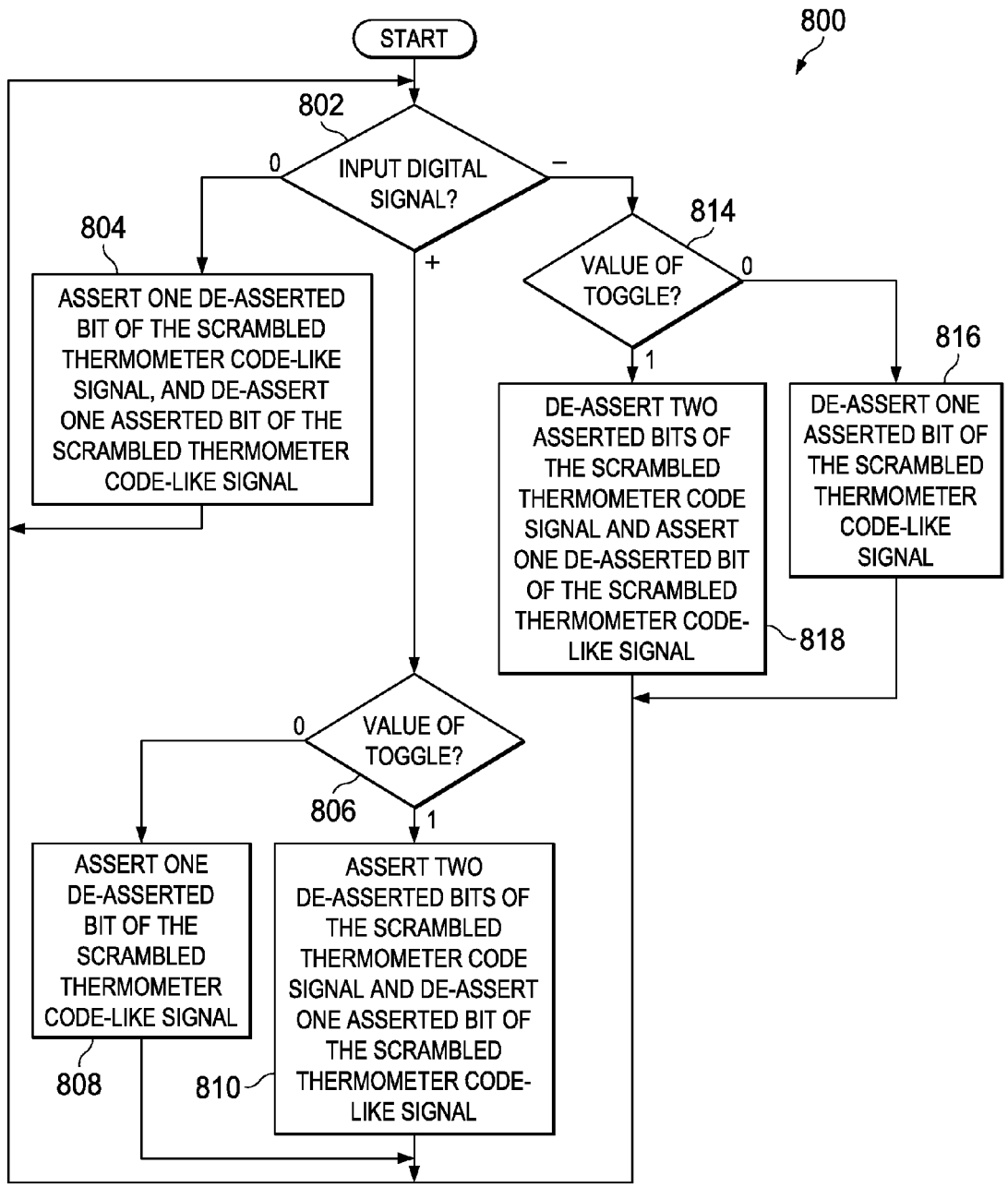
FIG. 8 illustrates a flow chart of another example method for generating a scrambled thermometer code-like signal based on an input digital signal, in accordance with embodiments of the present disclosure.

FIG. 8 illustrates a flow chart of an example method 800 for generating a scrambled thermometer code-like signal based on an input digital signal. According to certain embodiments, method 800 may begin at step 802. As noted above, teachings of the present disclosure may be implemented in a variety of configurations of ADC 300. As such, the preferred initialization point for method 800 and the order of the steps comprising method 800 may depend on the implementation chosen.

At step 802, scrambler 306 may determine whether the input digital signal indicates an equivalent quantization level change of the sampled filtered analog signal since the most-recent previous cycle. If no change in equivalent quantization level has occurred since the previous cycle, method 800 may proceed to step 804. If an increase in equivalent quantization level has occurred since the previous cycle (e.g., by a quantization level of 1 in embodiments in which the cycle-to-cycle change in the quantized value of digital feedback signal DIGITAL_FB is limited to 1), method 800 may proceed to step 806. If a decrease in equivalent quantization level has occurred since the previous cycle (e.g., by a quantization level of 1 in embodiments in which the cycle-to-cycle change in the quantized value of digital feedback signal DIGITAL_FB is limited to 1), method 800 may proceed to step 814.

At step 804, responsive to no change in equivalent quantization level, scrambler 306 may maintain asserted bits of the scrambled thermometer code-like signal except one asserted bit as asserted, maintain de-asserted bits of the scrambled thermometer code-like signal except one asserted bit as de-asserted, assert one de-asserted bit of the scrambled thermometer code-like signal, and de-assert one asserted bit of the scrambled thermometer code-like signal to generate a different code of the scrambled thermometer code-like signal that maintains the same quantized value of the scrambled thermometer code-like signal. After completion of step 804, method 800 may proceed again to step 802.

At step 806, responsive to an increase in equivalent quantization level, scrambler 306 may determine the value of a toggle variable. The toggle variable may be a single bit value that toggles between 0 and 1 and indicates whether one bit or three bits of the scrambled thermometer code-like signal should change in a given cycle in which there is no change in equivalent quantization level. In some embodiments, the toggle variable may toggle in each cycle in which there is a change in equivalent quantization level. In other embodiments, the toggle variable may toggle independently of the input digital signal (e.g., at some set or predetermined frequency). If the toggle variable is 0, method 800 may proceed to step 808. Otherwise, if the toggle variable is 1, method 800 may proceed to step 810.

At step 808, responsive to an increase in equivalent quantization level and a toggle variable of 0, scrambler 306 may maintain asserted bits of the scrambled thermometer code-like signal as asserted and assert one de-asserted bit of the scrambled thermometer code-like signal to increase the quantized value of the scrambled thermometer code-like signal by one quantization level. In some embodiments, the de-asserted bit to be asserted is randomly selected by scrambler 306. After completion of step 808, method 800 may proceed again to step 802.

At step 810, responsive to an increase in equivalent quantization level and a toggle variable of 1, scrambler 306 may maintain asserted bits of the scrambled thermometer code-like signal except one asserted bit as asserted, maintain de-asserted bits of the scrambled thermometer code-like signal except two de-asserted bits as de-asserted, assert two de-asserted bits of the scrambled thermometer code-like signal, and de-assert one asserted bit of the scrambled thermometer code-like signal to generate an equivalent code of the scrambled thermometer code-like signal. In some embodiments, the de-asserted bits to be asserted and the asserted bit to be de-asserted are randomly selected by scrambler 306. Thus, although three bits of the scrambled thermometer code-like signal change, the value of the scrambled thermometer code-like signal has a net increase of 1, and thus the same approximate value of analog feedback signal ANALOG_FB may be generated in response to the scrambled thermometer code-like signal as if only one de-asserted bit was asserted. After completion of step 810, method 800 may proceed again to step 802.

At step 814, responsive to a decrease in equivalent quantization level, scrambler 306 may determine the value of the toggle variable. If the toggle variable is 0, method 800 may proceed to step 816. Otherwise, if the toggle variable is 1, method 800 may proceed to step 818.

At step 816, responsive to a decrease in equivalent quantization level and a toggle variable of 0, scrambler 306 may maintain de-asserted bits of the scrambled thermometer code-like signal as de-asserted and de-assert one asserted bit of the scrambled thermometer code-like signal to decrease the quantized value of the scrambled thermometer code-like signal by one quantization level. In some embodiments, the asserted bit to be de-asserted is randomly selected by scrambler 306. After completion of step 816, method 800 may proceed again to step 802.

At step 818, responsive to a decrease in equivalent quantization level and a toggle variable of 1, scrambler 306 may maintain de-asserted bits of the scrambled thermometer code-like signal except one de-asserted bit as de-asserted, maintain asserted bits of the scrambled thermometer code-like signal except two asserted bits as asserted, de-assert two asserted bits of the scrambled thermometer code-like signal, and assert one de-asserted bit of the scrambled thermometer code-like signal to generate an equivalent code of the scrambled thermometer code-like signal. In some embodiments, the asserted bits to be de-asserted and the de-asserted bit to be asserted are randomly selected by scrambler 306. Thus, although three bits of the scrambled thermometer code-like signal change, the value of the scrambled thermometer code-like signal has a net decrease of 1, and thus the same approximate value of analog feedback signal ANALOG_FB may be generated in response to the scrambled thermometer code-like signal as if only one asserted bit was de-asserted. After completion of step 818, method 800 may proceed again to step 802.

Although FIG. 8 discloses a particular number of steps to be taken with respect to method 800, it may be executed with greater or lesser steps than those depicted in FIG. 8. In addition, although FIG. 8 discloses a certain order of steps to be taken with respect to method 800, the steps comprising method 800 may be completed in any suitable order.

Method 800 may be implemented using scrambler 306, components thereof or any other system such as those shown in FIGS. 2 and 3 operable to implement method 800. In certain embodiments, method 800 may be implemented partially or fully in software and/or firmware embodied in computer-readable media.

As a result of the application of functionality described in method 800, scrambler 306 may transition, on average over many cycles, approximately two bits of the scrambled thermometer code-like signal per cycle. To demonstrate an example application of the functionality of scrambler 306 shown in FIG. 8, reference is made to FIG. 9. FIG. 9 illustrates a table 900 setting forth an example input digital signal over numerous cycles and an example scrambled thermometer code-like signal that may be generated in response to the input digital signal. In the example shown in table 900, at cycle 0, scrambler 306 generates a scrambled thermometer code-like signal with value 0000 0000 1111 1111. In cycle 1, the input digital signal indicates an increase by one quantization level, and the toggle variable has a value of zero, such that in response, scrambler 306 randomly selects one of the bits of scrambled thermometer code-like signal de-asserted in cycle 0 to be asserted in cycle 1, while maintaining all asserted bits as asserted. In cycle 2, the input digital signal again indicates an increase by one quantization level, but in cycle 2, the toggle variable may have a value of 1, and in response, scrambler 306 randomly selects two of the bits of scrambled thermometer code-like signal de-asserted in cycle 1 to be asserted in cycle 2 and one of the bits of scrambled thermometer code-like signal asserted in cycle 1 to be de-asserted in cycle 2. In cycle 3, the input digital signal indicates no change in quantization level, and in response, scrambler 306 maintains asserted bits of the scrambled thermometer code-like signal except one asserted bit as asserted, maintains de-asserted bits of the scrambled thermometer code-like signal except one asserted bit as de-asserted, asserts one de-asserted bit of the scrambled thermometer code-like signal, and de-asserts one asserted bit of the scrambled thermometer code-like signal to generate a different code of the scrambled thermometer code-like signal that maintains the same quantized value of the scrambled thermometer code-like signal. In cycle 4, the input digital signal indicates a decrease by one quantization level, and the toggle variable may have a value of 1, such that in response, scrambler 306 randomly selects two of the bits of scrambled thermometer code-like signal asserted in cycle 3 to be de-asserted in cycle 4 and one of the bits of scrambled thermometer code-like signal de-asserted in cycle 3 to be asserted in cycle 4. In cycle 5, the input digital signal again indicates a decrease by one quantization level, but in cycle 5, the toggle variable may have a value of 0 and in response, scrambler 306 randomly selects one of the bits of scrambled thermometer code-like signal asserted in cycle 4 to be de-asserted in cycle 5, while maintaining all de-asserted bits as de-asserted. In cycle 6, the input digital signal does not change, and in response, scrambler 306 maintains asserted bits of the scrambled thermometer code-like signal except one asserted bit as asserted, maintains de-asserted bits of the scrambled thermometer code-like signal except one de-asserted bit as de-asserted, asserts one de-asserted bit of the scrambled thermometer code-like signal, and de-asserts one asserted bit of the scrambled thermometer code-like signal to generate a different code of the scrambled thermometer code-like signal that maintains the same quantized value of the scrambled thermometer code-like signal.

Discussion of methods 400, 600, and 800 were directed to embodiments in which each bit of scrambled thermometer code-like signal has the same weight. However, methods similar or identical to methods 400, 600, and 800 may be employed to generate scrambled thermometer code-like signals having one or more differently-weighted bits from an input digital signal.

Turning again to the mismatch correction subsystem discussed earlier, the mismatch correction subsystem may be calibrated during a calibration phase of ADC 300. In some embodiments, such calibration phase may be executed a single time (e.g., during factory manufacturing or by a vendor before delivery to an intended end user of the system comprising ADC 300). In these and other embodiments, a calibration phase may occur upon a powering up or other initialization of ADC 300 or a system comprising ADC 300, in which resistance values of digital-to-analog elements are assumed to be stable for duration of the power cycle. In these and other embodiments, a calibration phase may occur continuously during operation of ADC 300 (e.g., while ADC 300 is converting data).

In a calibration phase, mismatch calculation block 314 may calculate the mismatch of each digital-to-analog element of DAC 308. In some embodiments, the mismatch of each digital-to-analog element may be determined with reference to a single element referred to as a reference element. These calculated mismatches may then be used to populate correction weights table 316 which, for each digital-to-analog element of DAC 308, may set forth a normalized weighting for such digital-to-analog element to account for such digital-to-analog element's mismatch. During calibration, the reference element may be selected by scrambler 306, and one by one, other digital-to-analog elements of DAC 308 may be selected for the purpose of calibration with reference to the reference element. In other embodiments, all mismatches may be calculated in a single measurement iteration by applying an appropriate scrambling method by scrambler 306. The reference element may be reserved during the calibration phase, and thus may not be available for analog-to-digital conversion. Similarly, a digital-to-analog element of DAC 308 being calibrated may also not be available for regular modulation. In some embodiments, to support calibration without adversely affecting dynamic range of ADC 300, DAC 308 may include an extra two elements that may be used only during calibration. In other embodiments, calibration may be controlled as part of the modulation data of ADC 300, in which bits of a digital signal (e.g., the scrambled thermometer code-like signal) corresponding to the reference element and digital-to-analog element being calibrated may be toggled while maintaining the desired signals.

During calibration of a digital-to-analog element, the digital-to-analog element should have an opposite polarity to that of the reference element, such that the sum of the two elements will contribute zero current or voltage on the feedback signal if they were to be ideal, and such that simultaneously changing the polarity of both elements would contribute no change to the current or voltage on the feedback signal. Any suitable scheme for controlling polarity and identifying the two elements may be employed. For example, FIG. 10 shows example values of scrambled thermometer code-like signal over many cycles of an in-operation calibration phase in which the rightmost bit position (indicated with an underline) corresponds to the reference element and the leftmost bit position (indicated with bold and italics) corresponds to a digital-to-analog element being calibrated. As seen in FIG. 10, the bit position corresponding to the reference element and the bit position corresponding to a digital-to-analog element being calibrated are of opposite polarity and are shown to toggle in each cycle, such that their net effect is zero change in the quantized value of the scrambled thermometer code-like signal. In addition, other bits of the scrambled thermometer code-like signal and their corresponding digital-to-analog elements are still used as modulation data of ADC 300. In FIG. 10, the other bits of the scrambled thermometer-code like signal are shown as being generated in accordance with method 400. Although the bit position corresponding to the reference element and the bit position corresponding to a digital-to-analog element being calibrated are shown in FIG. 10 as toggling during each cycle, the frequency of toggle may be varied (e.g., every N cycles, where N is an integer equal to two or more) in order to characterize frequency response of the mismatch.

In practice, the digital-to-analog element being calibrated will have some mismatch compared to the reference element. If the polarity of the two elements is toggled at a fixed rate (e.g., such that their ideal sum remains constant), any contribution to the current or voltage of the feedback will be proportional to the mismatch of the digital-to-analog element being calibrated. Because this mismatch is toggled at a fixed frequency, it may result in the spectral energy of the mismatch being concentrated at the frequency of the toggle. Accordingly, mismatch calculation block 314 may employ a bandpass filter to select the frequency band around the expected mismatch spectrum. Furthermore, an adaptive algorithm may be employed by mismatch calculation block 314 to minimize the energy of the spectrum while calibrating for the desired digital-to-analog element.

As a result, the toggling of the reference element and the digital-to-analog element being calibrated may generate one mismatch signal to the mismatch correction subsystem to calculate the mismatch, wherein the mismatch signal has a magnitude substantially higher than one or more noise sources to the mismatch signal, including amplified analog input ANALOG_AMP signal itself, or one or more analog or digital signals derivative of the amplified analog input ANALOG_AMP. In addition, the mismatch signal may have a magnitude substantially higher than the one or more noise sources to the mismatch signal such that the mismatch correction subsystem is able to quickly calculate the mismatches within a required calibration time.

The selection of the reference element may be based on the coding scheme used for the feedback signal. If thermometer-type coding is not used, appropriate adjustments can be made to the above scheme to identify two unused elements and select one of them as a reference element.

Alternatively to the above, an individual element (rather than pairs of digital-to-analog elements) may be toggled and have spectral content, which is proportional to the transistor weight plus mismatch. Thus, it is possible to calibrate an amount of mismatch by comparing the spectrum observed with the desired spectrum of an ideal element.

The mismatches calculated by mismatch calculation block 314 may be stored in correction weights table 316, which may be embodied in a non-volatile memory or other computer-readable medium. As mentioned above, correction weights table 316 may include, for each digital-to-analog element of DAC 308, a normalized weighting for such digital-to-analog element to account for such digital-to-analog element's mismatch. In operation, digital correction block 312 may enable all values in correction weights table 316 corresponding to active digital-to-analog elements of DAC 308 to be summed by summer 318, thus applying a calibrated weight for each active digital-to-analog element to generate digital output signal DIGITAL_OUT.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A multilevel analog-to-digital converter having a digital-to-analog converter array of digital-to-analog elements, the multilevel analog-to-digital converter comprising:
   a mismatch correction subsystem for calculating mismatches among the digital-to-analog elements correcting for the mismatches; and
   an element selection subsystem for selecting enabled and disabled digital-to-analog elements in order to generate at least one mismatch signal to the mismatch correction subsystem to calculate the mismatches, wherein the at least one mismatch signal has a magnitude substantially higher than one or more noise sources to the mismatch signal.

2. The multilevel analog-to-digital converter of claim 1, wherein the one or more noise sources comprise an input signal to the multilevel analog-to-digital converter or an analog or digital derivative of the input signal.

3. The multilevel analog-to-digital converter of claim 1, wherein the at least one mismatch signal has a magnitude substantially higher than one or more noise sources to the mismatch signal such that the mismatch correction subsystem is able to calculate the mismatches within a required calibration time.

4. The multilevel analog-to-digital converter of claim 1, wherein the mismatch correction subsystem calculates a mismatch for a particular digital-to-analog element by comparing a response of the particular digital-to-analog element to a response of a reference digital-to-analog element.

5. The multilevel analog-to-digital converter of claim 4, wherein during comparison of the particular digital-to-analog element to the reference digital-to-analog element, the particular digital-to-analog element is toggled between enabled and disabled and the reference digital-to-analog element is toggled between enabled and disabled such that the particular digital-to-analog element is enabled when the reference digital-to-analog element is disabled and the particular digital-to-analog element is disabled when the reference digital-to-analog element is enabled in order to determine a mismatch of responses between the particular digital-to-analog element to the reference digital-to-analog element.

6. A method comprising:
   in a multilevel analog-to-digital converter having a digital-to-analog converter array of digital-to-analog elements, calculating mismatches among the digital-to-analog elements correcting for the mismatches; and
   selecting enabled and disabled digital-to-analog elements in order to generate at least one mismatch signal to calculate the mismatches, wherein the at least one mismatch signal has a magnitude substantially higher than one or more noise sources to the mismatch signal.

7. The method of claim 6, wherein the one or more noise sources comprise an input signal to the multilevel analog-to-digital converter or an analog or digital derivative of the input signal.

8. The method of claim 6, wherein the at least one mismatch signal has a magnitude substantially higher than one or more noise sources to the mismatch signal such that the mismatch correction subsystem is able to calculate the mismatches within a required calibration time.

9. The method of claim 6, further comprising calculating a mismatch for a particular digital-to-analog element by comparing a response of the particular digital-to-analog element to a response of a reference digital-to-analog element.

10. The method of claim 9, further comprising, during comparison of the particular digital-to-analog element to the reference digital-to-analog element:
    toggling the particular digital-to-analog element between enabled and disabled; and
    toggling the reference digital-to-analog element between enabled and disabled;
    such that the particular digital-to-analog element is enabled when the reference digital-to-analog element is disabled and the particular digital-to-analog element is disabled when the reference digital-to-analog element is enabled in order to determine a mismatch of responses between the particular digital-to-analog element and the reference digital-to-analog element.

11. An apparatus comprising:
    a scrambler element configured to receive an input signal and generate a scrambled thermometer code-like signal having a plurality of bits based on the input signal and having a plurality of possible quantization values, such that:
    the scrambler element generates at least one equivalent code of the scrambled thermometer code-like signal for each possible quantization value;
    for each of one or more of the possible quantization values, the scrambler element is configured to generate a plurality of possible equivalent codes of the scrambled thermometer code-like signal; and
    responsive to the input signal, the scrambler element changes the scrambled thermometer code-like signal by transitioning, on average, approximately the same number of the plurality of bits of the scrambled thermometer code-like signal.

12. The apparatus of claim 11, wherein the scrambler element is configured to:
    responsive to the input signal indicating an increase in quantization value, maintain asserted bits of the scrambled thermometer code-like signal as asserted and assert one de-asserted bit of the scrambled thermometer code-like signal to increase quantization value of the scrambled thermometer code-like signal; and responsive to the input signal indicating a decrease in quantization value, maintain de-asserted bits of the scrambled thermometer code-like signal as de-asserted and de-assert one asserted bit of the scrambled thermometer code-like signal to decrease quantization value of the scrambled thermometer code-like signal; and responsive to the input signal indicating no change in quantization value:

for approximately one-half of cycles of the scrambler element in which the input signal indicates no change in quantization value, maintain asserted bits of the scrambled thermometer code-like signal as asserted and maintain de-asserted bits of the scrambled thermometer code-like signal as de-asserted; and for approximately one-half of cycles of the scrambler element in which the input signal indicates no change in quantization value, maintain asserted bits of the scrambled thermometer code-like signal except one asserted bit as asserted, maintain de-asserted bits of the scrambled thermometer code-like signal except one de-asserted bit as de-asserted, assert one de-asserted bit of the scrambled thermometer code-like signal, and de-assert one asserted bit of the scrambled thermometer code-like signal to maintain the same quantization value of the scrambled thermometer code-like signal.

13. The apparatus of claim 12, wherein the de-asserted bits to be asserted are randomly selected and the asserted bits to be de-asserted are randomly selected.

14. The apparatus of claim 11, wherein the scrambler element is configured to:

responsive to the input signal indicating an increase in quantization value:

for approximately one-half of cycles of the scrambler element in which the input signal indicates an increase in quantization value, maintain asserted bits of the scrambled thermometer code-like signal as asserted and assert one de-asserted bit of the scrambled thermometer code-like signal to increase quantization value of the scrambled thermometer code-like signal; and for approximately one-half of cycles of the scrambler element in which the input signal indicates an increase in quantization value, maintain asserted bits of the scrambled thermometer code-like signal except one asserted bit as asserted, maintain de-asserted bits of the scrambled thermometer code-like signal except two de-asserted bits as de-asserted, assert two de-asserted bits of the scrambled thermometer code-like signal, and de-assert one asserted bit of the scrambled thermometer code-like signal to increase quantization value of the scrambled thermometer code-like signal;

responsive to the input signal indicating a decrease in quantization value:

for approximately one-half of cycles of the scrambler element in which the input signal indicates a decrease in quantization value, maintain de-asserted bits of the scrambled thermometer code-like signal as de-asserted and de-assert one asserted bit of the scrambled thermometer code-like signal to decrease quantization value of the scrambled thermometer code-like signal; and for approximately one-half of cycles of the scrambler element in which the input signal indicates a decrease in quantization value, maintain de-asserted bits of the scrambled thermometer code-like signal except one de-asserted bit as de-asserted, maintain asserted bits of the scrambled thermometer code-like signal except two asserted bits as asserted, de-assert two asserted bits of the scrambled thermometer code-like signal, and assert one de-asserted bit of the scrambled thermometer code-like signal to decrease quantization value of the scrambled thermometer code-like signal; and responsive to the input signal indicating no change in quantization value, maintain asserted bits of the scrambled thermometer code-like signal except one asserted bit as asserted, maintain de-asserted bits of the scrambled thermometer code-like signal except one de-asserted bit as de-asserted, assert one de-asserted bit of the scrambled thermometer code-like signal, and de-assert one asserted bit of the scrambled thermometer code-like signal to maintain the same quantization value of the scrambled thermometer code-like signal.

15. The apparatus of claim 14, wherein the de-asserted bits to be asserted are randomly selected and the asserted bits to be de-asserted are randomly selected.

16. The apparatus of claim 11, wherein the apparatus comprises a multilevel analog-to-digital converter further comprising:

a summation circuit that sums an analog input signal and an analog feedback signal to generate an added signal;

a noise-shaping filter for generating a filtered output signal in response to the added signal;

a multilevel quantizer having comparators fed by reference levels and the filtered output signal for generating the input signal based on the filtered output signal; and a digital-to-analog converter array of digital-to-analog elements configured to be selectively enabled and disabled based on the scrambled thermometer code-like signal, the digital-to-analog converter for generating the analog feedback signal in response to the scrambled thermometer code-like signal.

17. The apparatus of claim 16, further comprising a mismatch correction subsystem for generating an output signal based on the scrambled thermometer code-like signal to correct for mismatches among the digital-to-analog elements.

18. The apparatus of claim 17, wherein the mismatch correction subsystem calculates a mismatch for a particular digital-to-analog element by comparing a response of the particular digital-to-analog element to a response of a reference digital-to-analog element.

19. The apparatus of claim 18, wherein during comparison of the particular digital-to-analog element to the reference digital-to-analog element, the particular digital-to-analog element is toggled between enabled and disabled and the reference digital-to-analog element is toggled between enabled and disabled such that the particular digital-to-analog element is enabled when the reference digital-to-analog element is disabled and the particular digital-to-analog element is disabled when the reference digital-to-analog element is enabled in order to determine a mismatch of responses between the particular digital-to-analog element and the reference digital-to-analog element.

20. The apparatus of claim 19, wherein the particular digital-to-analog element and the reference digital-to-analog element are respectively toggled between enabled and disabled in response to toggling of bits of the scrambled thermometer code-like signal corresponding to the particular digital-to-analog element and the reference digital-to-analog element.

21. A method comprising:
receiving an input signal; and
generating a scrambled thermometer code-like signal having a plurality of bits based on the input signal and having a plurality of possible quantization values, such that:
at least one equivalent code of the scrambled thermometer code-like signal for each possible quantization value is generated;
for each of one or more codes of the input digital signal, a plurality of possible equivalent codes of the scrambled thermometer code-like signal may be generated; and
responsive to the input digital signal, the scrambled thermometer code-like signal is changed by transitioning, on average, approximately the same number of the plurality of bits of the scrambled thermometer code-like signal.

22. The method of claim 21, wherein generating the scrambled thermometer code-like signal comprises:
responsive to the input signal indicating an increase in quantization value, maintaining asserted bits of the scrambled thermometer code-like signal as asserted and asserting one de-asserted bit of the scrambled thermometer code-like signal to increase quantization value of the scrambled thermometer code-like signal; and
responsive to the input signal indicating a decrease in quantization value, maintaining de-asserted bits of the scrambled thermometer code-like signal as de-asserted and de-asserting one asserted bit of the scrambled thermometer code-like signal to decrease quantization value of the scrambled thermometer code-like signal; and
responsive to the input signal indicating no change in quantization value:
for approximately one-half of cycles of the scrambler element in which the input signal indicates no change in quantization value, maintaining asserted bits of the scrambled thermometer code-like signal as asserted and maintaining de-asserted bits of the scrambled thermometer code-like signal as de-asserted; and
for approximately one-half of cycles of the scrambler element in which the input signal indicates no change in quantization value, maintaining asserted bits of the scrambled thermometer code-like signal except one asserted bit as asserted, maintaining de-asserted bits of the scrambled thermometer code-like signal except one de-asserted bit as de-asserted, asserting one de-asserted bit of the scrambled thermometer code-like signal, and de-asserting one asserted bit of the scrambled thermometer code-like signal to maintain the same quantization value of the scrambled thermometer code-like signal.

23. The method of claim 22, wherein the de-asserted bits to be asserted are randomly selected and the asserted bits to be de-asserted are randomly selected.

24. The method of claim 21, wherein the scrambler element is configured to:
responsive to the input signal indicating an increase in quantization value:
for approximately one-half of cycles of the scrambler element in which the input signal indicates an increase in quantization value, maintaining asserted bits of the scrambled thermometer code-like signal as asserted and asserting one de-asserted bit of the scrambled thermometer code-like signal to increase quantization value of the scrambled thermometer code-like signal; and
for approximately one-half of cycles of the scrambler element in which the input signal indicates an increase in quantization value, maintaining asserted bits of the scrambled thermometer code-like signal except one asserted bit as asserted, maintaining de-asserted bits of the scrambled thermometer code-like signal except two de-asserted bits as de-asserted, asserting two de-asserted bits of the scrambled thermometer code-like signal, and de-asserting one asserted bit of the scrambled thermometer code-like signal to increase quantization value of the scrambled thermometer code-like signal;
responsive to the input signal indicating a decrease in quantization value:
for approximately one-half of cycles of the scrambler element in which the input signal indicates a decrease in quantization value, maintaining de-asserted bits of the scrambled thermometer code-like signal as de-asserted and de-asserting one asserted bit of the scrambled thermometer code-like signal to decrease quantization value of the scrambled thermometer code-like signal; and
for approximately one-half of cycles of the scrambler element in which the input signal indicates a decrease in quantization value, maintaining de-asserted bits of the scrambled thermometer code-like signal except one de-asserted bit as de-asserted, maintaining asserted bits of the scrambled thermometer code-like signal except two asserted bits as asserted, de-asserting two asserted bits of the scrambled thermometer code-like signal, and asserting one de-asserted bit of the scrambled thermometer code-like signal to decrease quantization value of the scrambled thermometer code-like signal; and
responsive to the input signal indicating no change in quantization value, maintaining asserted bits of the scrambled thermometer code-like signal except one asserted bit as asserted, maintaining de-asserted bits of the scrambled thermometer code-like signal except one de-asserted bit as de-asserted, asserting one de-asserted bit of the scrambled thermometer code-like signal, and de-asserting one asserted bit of the scrambled thermometer code-like signal to maintain the same quantization value of the scrambled thermometer code-like signal.

25. The apparatus of claim 24, wherein the de-asserted bits to be asserted are randomly selected and the asserted bits to be de-asserted are randomly selected.

26. The method of claim 21, further comprising:
summing an input signal and an analog feedback signal to generate an added signal;
generating a noise-shaped filtered output signal in response to the added signal;
generating the input digital signal based on the filtered output signal; and
selectively enabling and disabling a digital-to-analog converter array of digital-to-analog elements based on the scrambled thermometer code-like signal in order to generate the analog feedback signal in response to the scrambled thermometer code-like signal.

27. The method of claim 26, further comprising generating an output signal based on the scrambled thermometer code-like signal to correct for mismatches among the digital-to-analog elements.

28. The method of claim 27, further comprising calculating a mismatch for a particular digital-to-analog element by comparing a response of the particular digital-to-analog element to a response of a reference digital-to-analog element.

29. The method of claim 28, further comprising, during comparison of the particular digital-to-analog element to the reference digital-to-analog element:
- toggling the particular digital-to-analog element between enabled and disabled; and
- toggling the reference digital-to-analog element between enabled and disabled;
- such that the particular digital-to-analog element is enabled when the reference digital-to-analog element is disabled and the particular digital-to-analog element is disabled when the reference digital-to-analog element is enabled in order to determine a mismatch of responses between the particular digital-to-analog element to the reference digital-to-analog element.

30. The method of claim 29, further comprising respectively toggling the particular digital-to-analog element and the reference digital-to-analog element between enabled and disabled in response to toggling of bits of the scrambled thermometer code-like signal corresponding to the particular digital-to-analog element and the reference digital-to-analog element.

31. The method of claim 21, further comprising responsive to a particular magnitude change in quantization value:
- for approximately one-half of cycles of the scrambler element in which the input signal indicates the particular change in quantization value, transitioning the smallest possible number of the plurality of bits of the scrambled thermometer code-like signal to change the quantization value of the scrambled thermometer code-like signal by the particular magnitude change; and
- for approximately one-half of cycles of the scrambler element in which the input signal indicates the particular change in quantization value, transitioning two more than the smallest possible number of the plurality of bits of the scrambled thermometer code-like signal to change the quantization value of the scrambled thermometer code-like signal by the particular magnitude change.

32. The apparatus of claim 11, wherein the scrambler element is further configured to, responsive to a particular magnitude change in quantization value:
- for approximately one-half of cycles of the scrambler element in which the input signal indicates the particular change in quantization value, transition the smallest possible number of the plurality of bits of the scrambled thermometer code-like signal to change the quantization value of the scrambled thermometer code-like signal by the particular magnitude change; and
- for approximately one-half of cycles of the scrambler element in which the input signal indicates the particular change in quantization value, transition two more than the smallest possible number of the plurality of bits of the scrambled thermometer code-like signal to change the quantization value of the scrambled thermometer code-like signal by the particular magnitude change.

* * * * *